US012249397B2

(12) United States Patent
Park et al.

(10) Patent No.: US 12,249,397 B2
(45) Date of Patent: Mar. 11, 2025

(54) COMPUTING IN MEMORY ELECTRONIC DEVICE CAPABLE OF SUPPORTING CURRENT BASED ANALOG MULTIPLY-ACCUMULATION OPERATIONS AND TIME BASED ANALOG-TO-DIGITAL CONVERSION

(71) Applicant: Korea University Research and Business Foundation, Seoul (KR)

(72) Inventors: Jongsun Park, Seoul (KR); Hyunchul Park, Seoul (KR); Kyeongho Lee, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 164 days.

(21) Appl. No.: 17/987,072

(22) Filed: Nov. 15, 2022

(65) Prior Publication Data

US 2023/0420014 A1 Dec. 28, 2023

(30) Foreign Application Priority Data

Jun. 23, 2022 (KR) .................. 10-2022-0076991

(51) Int. Cl.
| | |
|---|---|
| *G11C 7/00* | (2006.01) |
| *G11C 7/12* | (2006.01) |
| *G11C 7/14* | (2006.01) |
| *G11C 8/08* | (2006.01) |
| *H03K 19/017* | (2006.01) |

(52) U.S. Cl.
CPC .................. *G11C 7/14* (2013.01); *G11C 7/12* (2013.01); *G11C 8/08* (2013.01); *H03K 19/01721* (2013.01)

(58) Field of Classification Search
CPC .... G11C 7/14; G11C 7/12; G11C 8/08; H03K 19/01721
USPC ....................................... 365/185.2
See application file for complete search history.

(56) References Cited

U.S. PATENT DOCUMENTS

| | | | |
|---|---|---|---|
| 10,009,038 B2* | 6/2018 | Chen ................ | H03M 1/1245 |
| 10,050,628 B2* | 8/2018 | Kim ................ | H03K 19/17748 |
| 10,061,272 B2* | 8/2018 | Chiu ................ | H03M 1/1245 |
| 10,895,850 B1* | 1/2021 | Elkholy ............ | G04F 10/005 |
| 11,176,991 B1 | 11/2021 | Shaik et al. | |
| 11,600,319 B2* | 3/2023 | Chiou .............. | G11C 11/412 |

FOREIGN PATENT DOCUMENTS

| | | |
|---|---|---|
| KR | 10-2016-0019594 A | 2/2016 |
| KR | 10-2020-0097208 A | 8/2020 |
| KR | 10-2021-0112272 A | 9/2021 |

OTHER PUBLICATIONS

Liu, Haizhu, et al. "A high linear voltage-to-time converter (VTC) with 1.2 V input range for time-domain analog-to-digital converters." Microelectronics Journal 88 (2019): 18-24.

(Continued)

*Primary Examiner* — Viet Q Nguyen
(74) *Attorney, Agent, or Firm* — NSIP Law (57) ABSTRACT

Embodiments of the present disclosure described herein relate to a computing in memory electronic device that supports current based analog operations and time based analog-to-digital conversion.

10 Claims, 7 Drawing Sheets

(56) References Cited

OTHER PUBLICATIONS

Chen, Zhiyu, et al. "CAP-RAM: A Charge-Domain In-Memory Computing 6T-SRAM for Accurate and Precision-Programmable CNN Inference." IEEE Journal of Solid-State Circuits 56.6 (2021): 1924-1935.

Korean Office Action issued on Oct. 31, 2023, in counterpart Korean Patent Application No. 10-2022-0076991 (7 pages in Korean).

* cited by examiner

COMPUTING IN MEMORY ELECTRONIC DEVICE CAPABLE OF SUPPORTING CURRENT BASED ANALOG MULTIPLY-ACCUMULATION OPERATIONS AND TIME BASED ANALOG-TO-DIGITAL CONVERSION

CROSS-REFERENCE TO RELATED APPLICATIONS

This application claims priority under 35 U.S.C. § 119 to Korean Patent Application No. 10-2022-0076991, filed on Jun. 23, 2022, in the Korean Intellectual Property Office, the disclosures of which are incorporated by reference herein in their entireties.

BACKGROUND

Embodiments of the present disclosure described herein relate to a computing in memory electronic device that supports current based analog operations and time based analog-to-digital conversion.

Since a memory supporting read/write operations and an operator supporting a data operation are separated in a conventional computer structure, the energy consumption generated by data movement between the memory and the operator is very large compared to the energy consumption used for the operation itself. In particular, a Multiply-Accumulate (MAC) operation, which is a multiply-accumulate operation used in the convolution layer of artificial neural networks, which is mainly used in modern applications, requires a huge amount of data. Therefore, much more energy is consumed in the movement of data required for such an artificial neural network operation than in a general operation. To solve this issue, a memory technology called computing-in-memory (CIM) has developed that reduces data movement between the memory and the operator by adding computing operations in the memory performing only read/write operations.

However, the conventional CIM memory technology has an issue in that energy efficiency is reduced since an area occupied by an additional analog-to-digital converter (ADC) is large and power consumption is also large.

SUMMARY

Embodiments of the present disclosure provide a computing-in-memory electronic device supporting current-based analog operation capable of obtaining high energy efficiency and time-based analog-to-digital conversion by reducing the number of data movement between the memory and the operator in artificial intelligence operations such as deep neural networks (DNNs) by performing the MAC operation in the memory, and by sequentially converting the operation result into a time domain and a digital domain.

According to an embodiment of the present disclosure, an electronic device includes a memory cell array including a plurality of memory cells that performs a product operation of an input signal applied through a plurality of operation word lines and a pre-stored weight and outputs a first output signal according to the product operation to a plurality of operation bit lines, a dummy cell array including a plurality of dummy cells that generates a reference signal and to output the reference signal to a plurality of dummy bit lines, a plurality of VTC circuits that receive a second output signal obtained by summing the first output signal through the plurality of operation bit lines and the reference signal and convert the second output signal and the reference signal into a time domain, and a plurality of TDC circuits that compare the converted second output signal with the converted reference signal and convert the converted second output signal into a digital domain based on a result of the comparison.

According to an embodiment, the plurality of operation bit lines may be charged with a preset charging voltage through a precharging circuit, may have a voltage reduced than the preset charging voltage when the input signal is the same as the pre-stored weight, and may maintain the preset charging voltage when the input signal is different from the pre-stored weight.

According to an embodiment, a pulse width of the input signal may be set to be less than or equal to a preset width to maintain a linearity of the second output signal.

According to an embodiment, each of the plurality of VTC circuits may include a pull-down circuit that generates a pull-down current and to discharge the second output signal and the reference signal based on the pull-down current, and a conversion circuit that outputs a signal corresponding to logic '0' when voltages of the second output signal and the reference signal exceed a threshold voltage and outputs a signal corresponding to logic '1' when the voltages of the second output signal and the reference signal are equal to or less than the threshold voltage.

According to an embodiment, each of the plurality of VTC circuits may discharge the second output signal to a voltage of the same level.

According to an embodiment, each of the plurality of dummy cells may store a dummy weight corresponding to logic '0' or logic '1'.

According to an embodiment, the plurality of dummy cells may be defined as a plurality of dummy columns connected to each of the plurality of dummy bit lines, and the reference signal may be generated for each of the plurality of dummy columns and may be generated to have an earlier phase in the time domain, as the number of logic '1' increases among the dummy weights stored in each of the plurality of dummy columns.

According to an embodiment, each of the plurality of TDC circuits may convert the second output signal into logic '0' when a phase of the second output signal is later than that of the reference signal, and may convert the second output signal into logic '1' when the phase of the second output signal is earlier than that of the reference signal.

According to an embodiment of the present disclosure, an electronic device includes a control circuit that generates a first enable signal, a second enable signal, and a dummy word line signal, a driver circuit that generates an input signal based on the first enable signal and transfers the input signal to a plurality of operation word lines, a memory cell array that performs a product operation of the input signal and a pre-stored weight and outputs a first output signal according to the product operation to a plurality of operation bit lines, a dummy cell array that generates a reference signal based on the dummy word line signal and outputs the reference signal to a plurality of dummy bit lines, a VTC array that receives a second output signal obtained by summing the first output signal through the plurality of operation bit lines and the reference signal and converts the second output signal and the reference signal into a time domain, and a TDC array that compares the converted second output signal with the converted reference signal and converts the converted second output signal into a digital domain based on a result of the comparison.

According to an embodiment, the dummy cell array may include a plurality of dummy cells, each of the plurality of dummy cells may store a dummy weight corresponding to logic '0' or logic '1', the plurality of dummy cells may be defined as a plurality of dummy columns connected to each of the plurality of dummy bit lines, and the reference signal may be generated for each of the plurality of dummy columns and may be generated to have an earlier phase in the time domain, as the number of logic '1' increases among the dummy weights stored in each of the plurality of dummy columns.

BRIEF DESCRIPTION OF THE FIGURES

The above and other objects and features of the present disclosure will become apparent by describing in detail embodiments thereof with reference to the accompanying drawings.

DETAILED DESCRIPTION

Hereinafter, embodiments of the present disclosure may be described in detail and clearly to such an extent that an ordinary one in the art easily implements the present disclosure.

Figure 1:
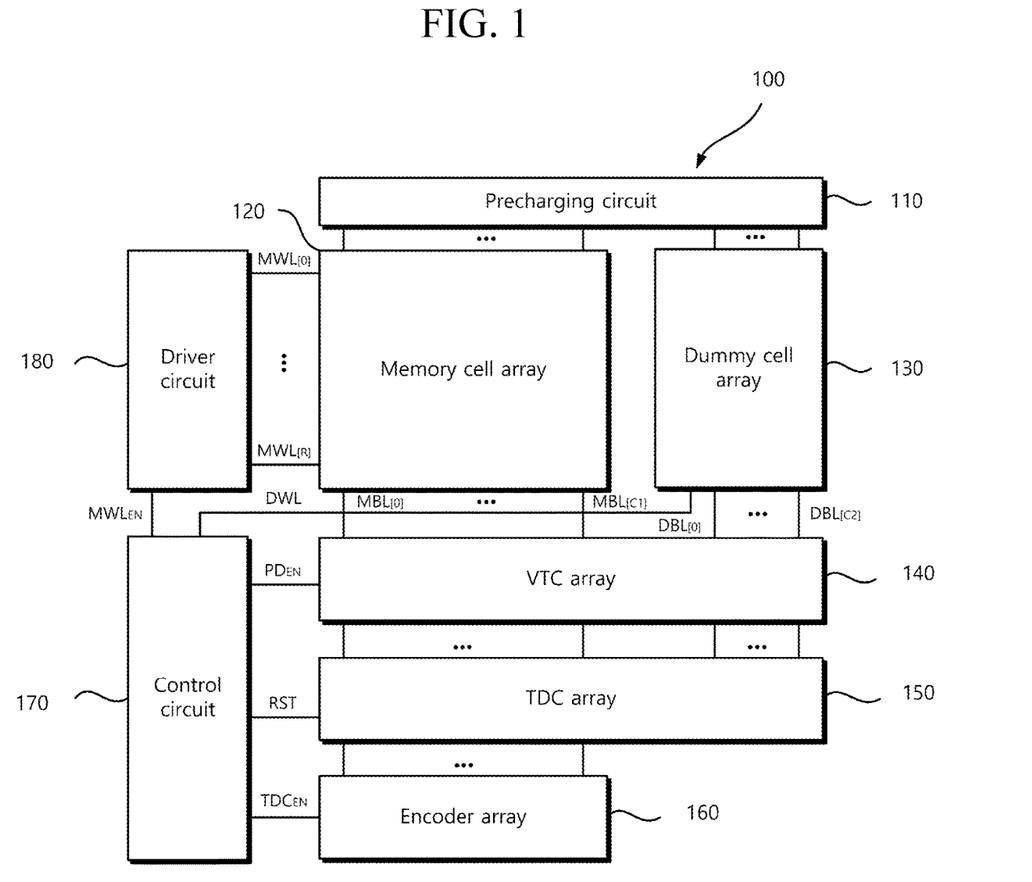
FIG. 1 is a diagram illustrating an electronic device, according to an embodiment of the present disclosure.

FIG. 1 is a diagram illustrating an electronic device, according to an embodiment of the present disclosure.

Referring to FIG. 1, an electronic device 100 according to an embodiment of the present disclosure includes a precharging circuit 110, a memory cell array 120, a dummy cell array 130, and a voltage-to-time converting (VTC) array 140, a time-to-digital converting (TDC) array 150, an encoder array 160, a control circuit 170, and a driver circuit 180.

The precharging circuit 110 is connected to a plurality of operation bit lines $MBL_{[0]}$ to $MBL_{[C1]}$ to precharge the plurality of operation bit lines $MBL_{[0]}$ to $MBL_{[C1]}$ to a specific voltage. The precharging circuit 110 may precharge the plurality of operation bit lines $MBL_{[0]}$ to $MBL_{[C1]}$ connected to the memory cell array 120 and the dummy cell array 130 to a specific voltage, based on a precharging signal PREb, and for example, when the precharging signal PREb corresponds to logic '0', the precharging may be performed.

The memory cell array 120 performs a product operation of an input signal applied through a plurality of operation word lines $MWL_{[0]}$ to $MWL_{[R]}$ and a pre-stored weight, and outputs a first output signal according to the product operation to a plurality of operation bit lines of $MBL_{[0]}$ to $MBL_{[C1]}$. The input signal and the weight may have a value corresponding to one of '−1' or '1', which is an expression value, when the electronic device 100 is used for a Binarized Neural Network (BNN) during DNN operation, as an example.

In the present disclosure, the product operation performed by the memory cell array 120 may be, for example, an exclusive OR (XOR) or an exclusive NOR (XNOR) between the input signal and the weight. In detail, when the input signal and the weight have the same expression value, the result of the product operation may have a first state value, and when the input signal and the weight have different expression values, the result of the product operation may have the second state value.

The memory cell array 120 includes a plurality of memory cells, and each of the plurality of memory cells stores a weight. The weight may be stored in each memory cell based on a word line that is separately connected to a memory cell to store a weight, other than the plurality of operation word lines $MWL_{[0]}$ to $MWL_{[R]}$.

When the memory cell array 120 outputs the first output signal corresponding to the result of the product operation performed on each of the plurality of memory cells to the plurality of operation bit lines $MBL_{[0]}$ to $MBL_{[C1]}$, each operation bit line receives the first output signals from at least some of the plurality of memory cells connected to each operation bit line. Accordingly, the sum operation may be performed by overlapping the first output signals on each operation bit line. A signal obtained by summing the first output signals through the plurality of operation bit lines $MBL_{[0]}$ to $MBL_{[C1]}$ may be defined as a second output signal. The second output signal may have a value in which voltage levels of the first output signals are accumulated according to the sum operation.

As described above, the memory cell array 120 performs a MAC operation defined as a product operation and a sum operation between the input signal and the weight, and transfers the second output signal resulting from the MAC operation to the VTC array 140 through the plurality of operation bit lines $MBL_{[0]}$ to $MBL_{[C1]}$.

The dummy cell array 130 generates a reference signal and outputs the reference signal to a plurality of dummy bit lines $DBL_{[0]}$ to $DBL_{[C2]}$. The dummy cell array 130 performs a product operation of a dummy word line signal input through a dummy word line DWL and a dummy weight, and outputs a result signal according to the product operation to the plurality of dummy bit lines $DBL_{[0]}$ to $DBL_{[C2]}$. In this case, the dummy word line signal may always have a value corresponding to logic '1'.

The dummy cell array 130 includes a plurality of dummy cells. Each of the plurality of dummy cells stores a dummy weight corresponding to logic '0' or logic '1'.

Like the above-described memory cell array 120, a sum operation may also be performed on the result signal obtained by the product operation of the dummy cell array 130 by accumulating result signals in each of the plurality of dummy bit lines $DBL_{[0]}$ to $DBL_{[C2]}$. A result of the sum operation performed on each of the plurality of dummy bit lines $DBL_{[0]}$ to $DBL_{[C2]}$ may be defined as the reference signal.

The dummy cell array 130 transfers the generated reference signal to the VTC array 140 through the plurality of dummy bit lines $DBL_{[0]}$ to $DBL_{[C2]}$.

The VTC array 140 receives the second output signal through the plurality of operation bit lines $MBL_{[0]}$ to $MBL_{[C1]}$, receives the reference signal through the plurality of dummy bit lines $DBL_{[0]}$ to $DBL_{[C2]}$, and converts the second output signal and the reference signal into the time domain. The VTC array 140 transfers the second output signal converted into the time domain to the TDC array 150 through the plurality of operation bit lines $MBL_{[0]}$ to $MBL_{[C1]}$, and transfers the reference signal converted into the time domain to the TDC array 150 through the plurality of dummy bit lines $DBL_{[0]}$ to $DBL_{[C2]}$.

The VTC array 140 may include a plurality of VTC circuits. Each of the plurality of VTC circuits may receive the second output signal and the reference signal and may convert them from an analog domain to the time domain.

The TDC array 150 compares the converted second output signal with the converted reference signal, and converts the converted second output signal into a digital domain based on a result of the comparison. The TDC array 150 may compare phases of the converted second output signal and the converted reference signal in the time domain. According to the comparison result, the TDC array 150 converts the converted second output signal into logic '0' when the phase of the converted second output signal is later than that of the converted reference signal, and converts the converted second output signal into logic '1' when the phase of the converted second output signal is earlier than that of the converted reference signal.

The second output signal converted to the digital domain by the TDC array 150 may be defined as a thermometer code.

The TDC array 150 transfers the second output signal converted into the digital domain to the encoder array 160 through the plurality of operation bit lines $MBL_{[0]}$ to $MBL_{[C1]}$.

The TDC array 150 may include a plurality of TDC circuits. Each of the plurality of TDC circuits may compare the converted second output signal with the converted reference signal to convert the converted second output signal from the time domain to the digital domain.

The encoder array 160 may receive the second output signal, that is, a thermometer code, converted into the digital domain from the TDC array 150, and may encode the thermometer code to generate a final digital output signal.

The encoder array 160 may include a plurality of encoders. Each of the plurality of encoders may convert the thermometer code into a digital output signal.

The control circuit 170 generates a first enable signal $MWL_{EN}$, a second enable signal $PD_{EN}$, a dummy word line signal, a reset signal RST, and a third enable signal $TDC_{EN}$. In this case, the first enable signal $MWL_{EN}$ may be defined as a signal for driving the driver circuit 180, the second enable signal $PD_{EN}$ may be defined as a signal for driving the VTC array 140, the reset signal RST may be defined as a signal for resetting the TDC array 150, and the third enable signal $TDC_{EN}$ may be defined as a signal for driving the encoder array 160. The dummy word line signal is as described above.

The control circuit 170 transfers the first enable signal $MWL_{EN}$ to the driver circuit 180, transfers the second enable signal $PD_{EN}$ to the VTC array 140, transfers the dummy word line signal to the dummy cell array 130, transfers the reset signal RST to the TDC array 150, and transfers the third enable signal $TDC_{EN}$ to the encoder array 160.

The driver circuit 180 generates an input signal based on the first enable signal $MWL_{EN}$ and transfers the input signal to the plurality of operation word lines $MWL_{[0]}$ to $MWL_{[R]}$.

According to the electronic device 100 of the present disclosure described above, since the MAC operation may be performed in the memory, energy efficiency may be increased. In particular, since the result of the MAC operation is converted through TDC unlike the conventional ADC, the present disclosure may have advantages over the conventional ADC in terms of circuit area, power consumption, and energy efficiency.

Hereinafter, each component included in the electronic device 100 will be described in more detail.

Figure 2:
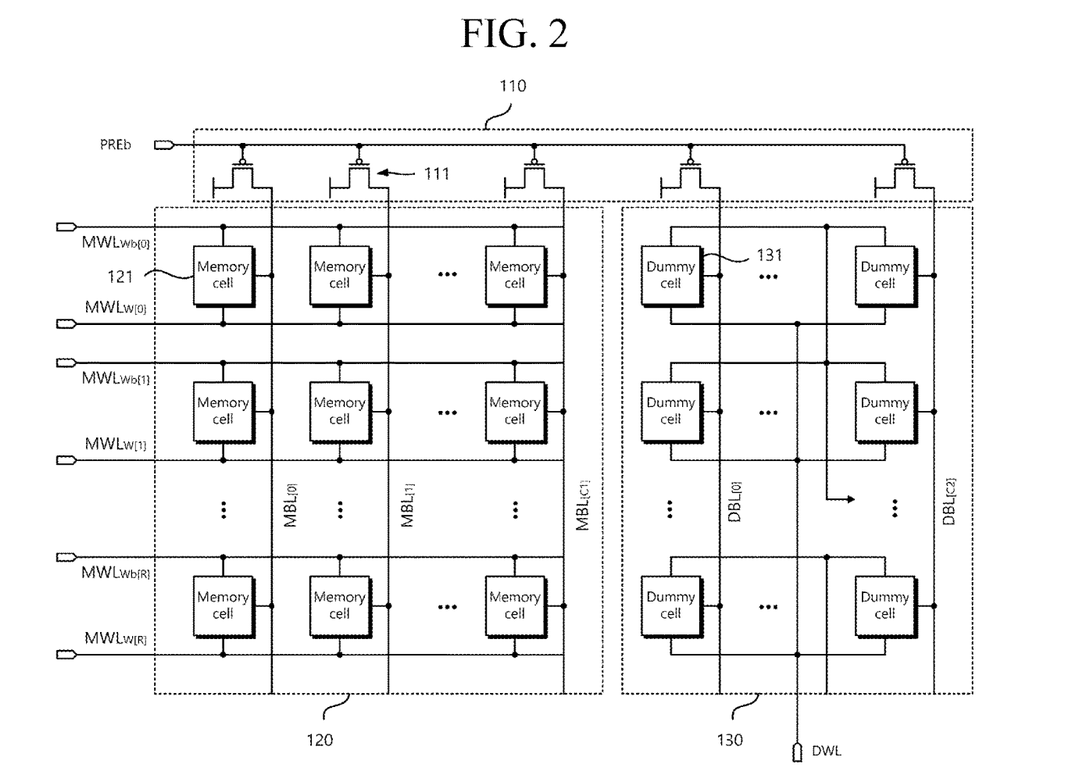
FIG. 2 is a diagram illustrating a precharging circuit, a memory cell array, and a dummy cell array, according to an embodiment of the present disclosure.

FIG. 2 is a diagram illustrating a precharging circuit, a memory cell array, and a dummy cell array, according to an embodiment of the present disclosure.

Referring to FIG. 2, the plurality of memory cell arrays 120 are connected to the plurality of operation word lines $MWL_{[0]}$ to $MWL_{[R]}$ to receive an input signal. Each of the plurality of operation word lines $MWL_{[0]}$ to $MWL_{[R]}$ may include first operation word lines $MWL_{W[0]}$ to $MWL_{W[R]}$ and second operation word lines $MWL_{Wb[0]}$ to $MWL_{Wb[R]}$. The first operation word lines $MWL_{W[0]}$ to $MWL_{W[R]}$ and the second operation word lines $MWL_{Wb[0]}$ to $MWL_{Wb[R]}$ may transfer complementary input signals. The plurality of operation word lines $MWL_{[0]}$ to $MWL_{[R]}$ may have indices of '0' to 'R' (where 'R' is a natural number).

The precharging circuit 110 and the plurality of memory cells 121 included in the memory cell array 120 are connected to each other through the plurality of operation bit lines $MBL_{[0]}$ to $MBL_{[C1]}$. Each of the plurality of operation bit lines $MBL_{[0]}$ to $MBL_{[C1]}$ is connected to at least some of the plurality of memory cells 121, and at least some of the memory cells 121 connected to one operation bit line may be defined as one operation column. The first output signals multiplied by each of the memory cells 121 included in the operation column are accumulated in the operation column to become the second output signal. The plurality of operation bit lines $MBL_{[0]}$ to $MBL_{[C1]}$ may have indices of '0' to 'C1' (where 'C1' is a natural number).

The dummy cell array 130 is connected to the dummy word line DWL to receive a dummy word line signal. One dummy word line DWL is provided to apply the same dummy word line signal to all dummy cells 131.

The precharging circuit 110 and the plurality of dummy cells 131 included in the dummy cell array 130 are connected to each other through the plurality of dummy bit lines $DBL_{[0]}$ to $DBL_{[C2]}$. Each of the plurality of dummy bit lines $DBL_{[0]}$ to $DBL_{[C2]}$ is connected to at least some of the plurality of dummy cells 131, and at least some of the dummy cells 131 connected to one dummy bit line may be defined as one dummy column. A result obtained by multiplying each of the dummy cells 131 connected to one dummy column is accumulated through one dummy bit line to generate the reference signal. The plurality of dummy bit lines $DBL_{[0]}$ to $DBL_{[C2]}$ may have indices of '0' to 'C2' (where 'C2' is a natural number).

The precharging circuit 110 includes a plurality of precharging transistors 111. Each of the precharging transistors 111 is turned on/off depending on the precharging signal PREb to charge the plurality of operation bit lines $MBL_{[0]}$ to $MBL_{[C1]}$ and the plurality of dummy bit lines $DBL_{[0]}$ to $DBL_{[C2]}$ with a preset charging voltage.

The memory cell array 120 performs a product operation based on the plurality of memory cells 121, and the first output signal according to the result of the product operation becomes the second output signal by being accumulated in each of the plurality of operation bit lines $MBL_{[0]}$ to $MBL_{[C1]}$.

The dummy cell array 130 performs a product operation between the dummy word line signal and the dummy weight based on the plurality of dummy cells 131 as described above, and performs a sum operation according to the accumulation of the result of the product operation to generate the reference signal.

Figure 3:
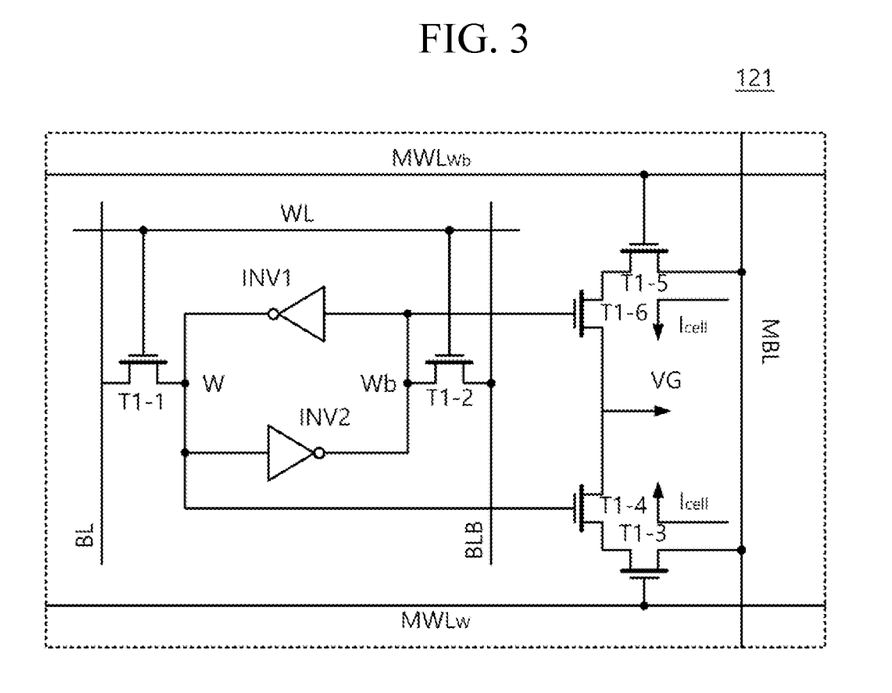
FIG. 3 is a diagram illustrating a memory cell included in FIG. 2.

FIG. 3 is a diagram illustrating a memory cell included in FIG. 2.

Referring to FIG. 3, one memory cell 121 includes 1-1 to 1-6 transistors T1-1 to T1-6, a first inverter INV1, and a second inverter INV2. The 1-1 transistor T1-1 and the 1-2 transistor T1-2 have a gate connected to a word line WL, one end connected to a first node W and a second node Wb, respectively, and the other end connected to a bit line BL and a complementary bit line BLB, respectively. In this case, the one end may be a source or a drain, and the other end may be a drain or a source. The 1-1 transistor T1-1 and the 1-2 transistor T1-2 transfer a signal for weight storage applied from the word line WL to the first inverter INV1 and the second inverter INV2 connected to first node W and the second node Wb.

Thereafter, when the 1-1 transistor T1-1 and the 1-2 transistor T1-2 are turned off, a weight corresponding to one of '−1' or '1' is stored in a loop by the first inverter INV1 and the second inverter INV2.

The stored weight may be read through the bit line BL or the complementary bit line BLB. The 1-3 transistor T1-3 has a gate connected to the first operation word line $MWL_W$, one end connected to the 1-4 transistor T1-4, and the other end connected to the operation bit line MBL. The 1-4 transistor T1-4 has a gate connected to the first node W, one end connected to the 1-3 transistor T1-3, and the other end connected to the 1-6 transistor T1-6. The 1-5 transistor T1-5 has a gate connected to the second operation word line $MWL_{Wb}$, one end connected to the 1-6 transistor T1-6, and the other end connected to the operation bit line MBL. The 1-6 transistor T1-6 has a gate connected to the second node Wb, one end connected to the 1-5 transistor T1-5, and the other end connected to the 1-4 transistor T1-4. The 1-3 transistor to the 1-6 transistor T1-3 to T1-6 are turned on/off in response to an input signal or a weight applied to each gate. According to an embodiment, a product operation is performed as illustrated in Table 1 below according to on/off.

TABLE 1

| | | Weight | |
| --- | --- | --- | --- |
| | | +1 | −1 |
| | | W/Wb | |
| Input | $MWL_{W/Wb}$ | VDD/VSS | VSS/VDD |
| +1 | VDD/VSS | ΔV(Icell) | 0 |
| −1 | VSS/VDD | 0 | ΔV(Icell) |

Referring to Table 1, when both the input signal 'Input' and the weight 'Weight' are +1, the first operation word line $MWL_W$ and the first node W have a VDD voltage level. Accordingly, the 1-3 transistor T1-3 and the 1-4 transistor T1-4 are turned on and a current Icell flows from the operation bit line MBL to a VG. Accordingly, the operation bit line MBL, which is precharged with the preset charging voltage, has a voltage level reduced by ΔV from the charging voltage.

When both the input signal 'Input' and the weight 'Weight' are −1, the second operation word line $MWL_{Wb}$ and the second node Wb have the VDD voltage level. Accordingly, the 1-5 transistor T1-5 and the 1-6 transistor T1-6 are turned on and the current Icell flows from the operation bit line MBL to a VG. Accordingly, the operation bit line MBL, which is precharged with the preset charging voltage, has a voltage level reduced by ΔV from the charging voltage.

When the input signal 'Input' and the weight 'Weight' are different from each other, the current Icell does not flow, and accordingly, the operation bit line MBL maintains the preset charging voltage.

In summary, when the input signal and the pre-stored weight are the same, the voltage is reduced from the preset charging voltage, and when the input signal and the pre-stored weight are different from each other, the preset charging voltage is maintained, such that the product operation may be performed.

Table 1 illustrates XNOR as an example, but unlike Table 1, the product operation may be performed by XOR.

According to an embodiment, a node voltage connected to one end of the 1-4 transistor T1-4 and the other end of the 1-6 transistor T1-6 may have a VG voltage value which is a voltage capable of slowing a discharge rate of the operation bit line MBL.

Figure 4:
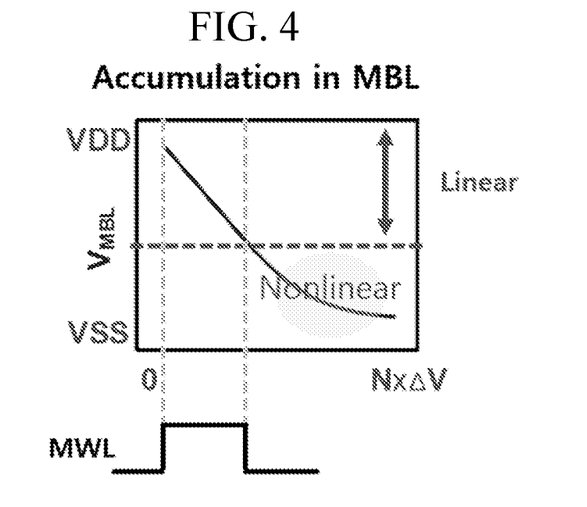
FIG. 4 is a diagram for describing a voltage level of an operation bit line.

FIG. 4 is a diagram for describing a voltage level of an operation bit line.

Referring to FIG. 4, a pulse width of an input signal MWL applied to the operation word line according to an embodiment may be set to be less than or equal to a preset width to maintain a linearity of the second output signal. A voltage level $V_{MBL}$ of the second output signal has a linear region and a nonlinear region according to an accumulation, and when the pulse width of the second output signal is generated to have a length corresponding to the linear region of the voltage level $V_{MBL}$ of the second output signal, a voltage difference between accumulated values may be the same, and accordingly, accuracy drop may be prevented.

Figure 5:
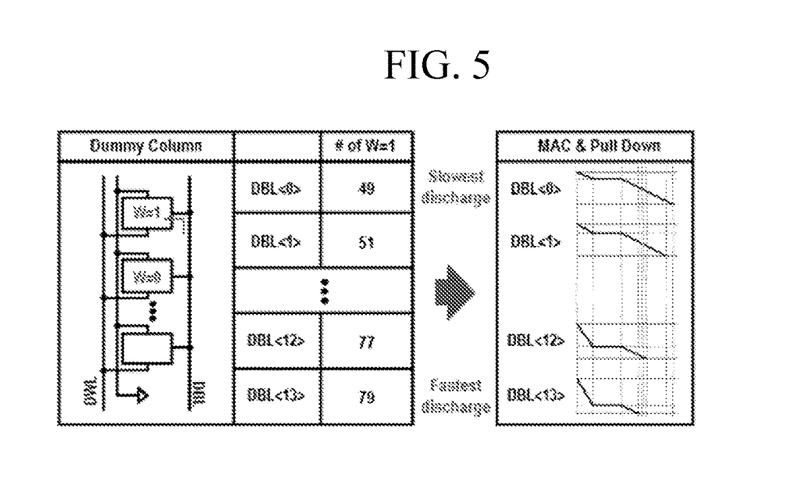
FIG. 5 is a diagram for describing an operation of a dummy cell array.

FIG. 5 is a diagram for describing an operation of a dummy cell array.

Referring to FIG. 5, the dummy cell array 130 may be defined as a plurality of dummy columns connected to each of the plurality of dummy bit lines $DBL_{[0]}$ to $DBL_{[C2]}$, as described above. The reference signal is generated for each of the plurality of dummy columns. In this case, the reference signal may be generated to have an earlier phase in the time domain as the number of logic '1' increases among the dummy weights stored in each of the plurality of dummy columns.

For example, as illustrated in FIG. 5, when there are 14 dummy columns DBL<0> to DBL<13>, and as the indexes <0> to <13> of the dummy column increase, when the number of logic '1' in the dummy weights increases, it may be seen that the speed at which the reference signal is discharged by the VTC array 140, that is, pulled down, increases depending on that the number of logic '1' (# of W=1) increases. When the discharge speed is increased, the reference signal may have an earlier phase when the reference signal is converted into the time domain by the VTC array 140.

Figure 6:
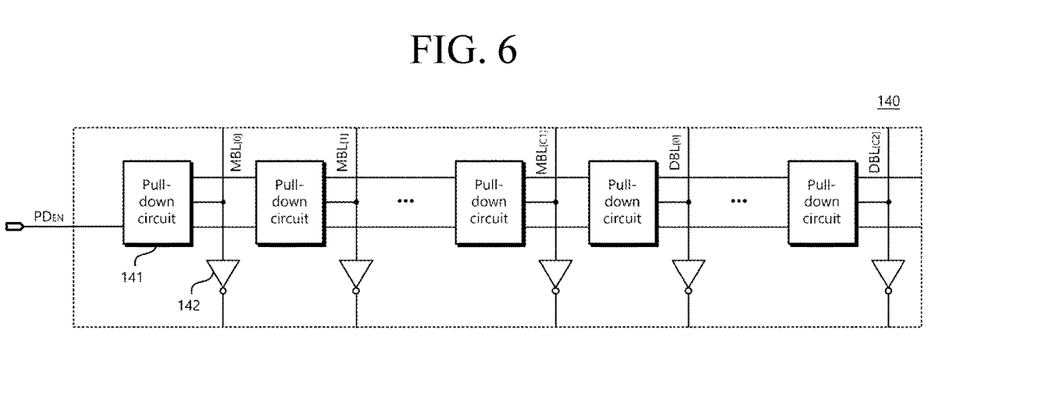
FIG. 6 is a diagram illustrating a VTC array, according to an embodiment of the present disclosure.

FIG. 6 is a diagram illustrating a VTC array, according to an embodiment of the present disclosure.

Referring to FIG. 6, the VTC array 140 includes a plurality of pull-down circuits 141 and a plurality of conversion circuits 142. Each of the plurality of pull-down circuits 141 is connected to one of the plurality of operation bit lines $MBL_{[0]}$ to $MBL_{[C1]}$ and the plurality of dummy bit lines $DBL_{[0]}$ to $DBL_{[C2]}$, and one conversion circuit 142. In addition, one pull-down circuit 141 and one conversion circuit 142 may be referred to as the VTC circuit.

The plurality of pull-down circuits 141 are enabled in response to the second enable signal $PD_{EN}$. Each of the plurality of pull-down circuits 141 pulls down, that is, discharges the second output signal and the reference signal received from the plurality of operation bit lines $MBL_{[0]}$ to $MBL_{[C1]}$ and the plurality of dummy bit lines $DBL_{[0]}$ to $DBL_{[C2]}$.

According to an embodiment, at least some of the plurality of pull-down circuits 141 connected to the plurality of operation bit lines $MBL_{[0]}$ to $MBL_{[C1]}$ may discharge the second output signal to a voltage having the same level. Accordingly, the second output signal may be converted into the time domain with a time difference proportional to the voltage level difference even if the second output signal has different voltage levels according to the MAC operation.

When the voltage levels of the second output signal and the reference signal are discharged, the conversion circuit 142 outputs a signal corresponding to logic '0' when the voltages of the second output signal and the reference signal exceed a threshold voltage, and the conversion circuit 142 outputs a signal corresponding to logic '1' when the voltages of the second output signal and the reference signal are less than or equal to the threshold voltage.

Figure 7:
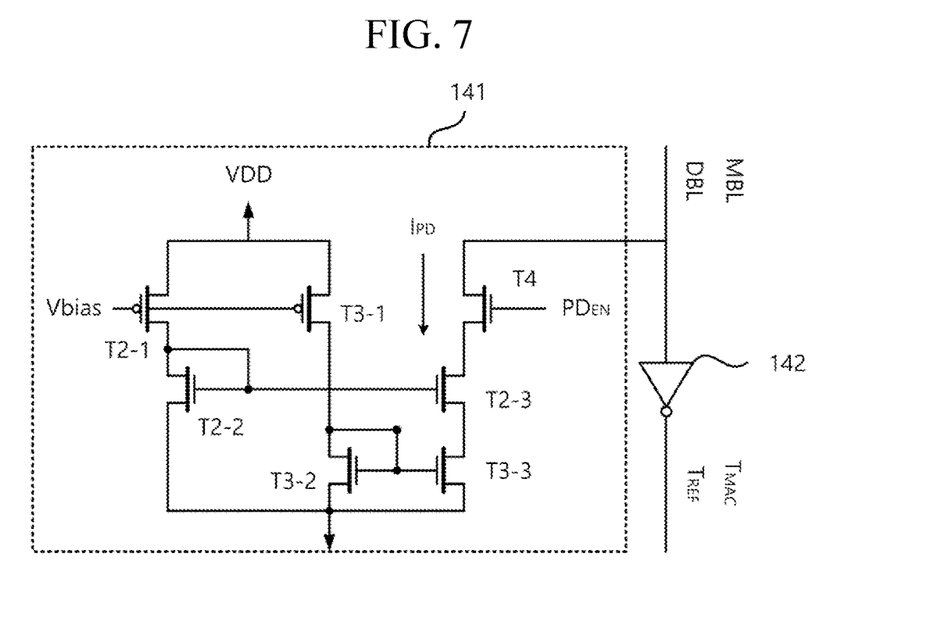
FIG. 7 is a diagram illustrating a VTC circuit included in FIG. 6.

FIG. 7 is a diagram illustrating a VTC circuit included in FIG. 6.

Referring to FIG. 7, one VTC circuit includes the pull-down circuit 141 and the conversion circuit 142 as described above, and the pull-down circuit 141 generates a pull-down current $I_{PD}$, and discharges the second output signal based on the pull-down current $I_{PD}$. The pull-down circuit 141 includes 2-1 to 2-3 transistors T2-1 to T2-3, 3-1 to 3-3 transistors T3-1 to T3-3, and a fourth transistor.

The 2-1 to 2-3 transistors T2-1 to T2-3 correspond to one current mirror circuit, and the 3-1 to 3-3 transistors T3-1 to T3-3 also correspond to one current mirror circuit.

A bias voltage Vbias is applied to the gates of the 2-1 transistor T2-1 and the 3-1 transistor T3-1, and the 2-1 to 2-3 transistors T2-1 to T2-3 and the 3-1 to 3-3 transistors T3-1 to T3-3 allow the pull-down current $I_{PD}$ to flow through the fourth transistor through a current mirror operation as is known.

The fourth transistor is turned on/off in response to the second enable signal $PD_{EN}$ to discharge the pull-down current $I_{PD}$ from the operation bit line and the dummy bit line. When discharge by the pull-down current $I_{PD}$ occurs in the second output signal and the reference signal, the conversion circuit 142 compares the discharged second output signal and the discharged reference signal with the threshold voltage to output logic '0' or logic '1'.

Figure 8:
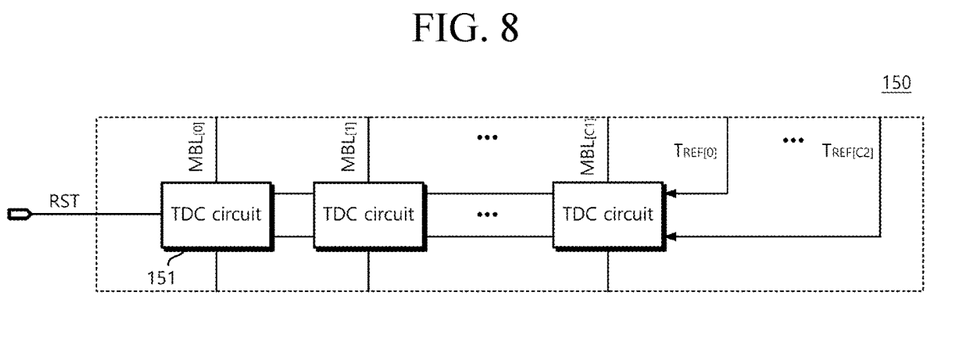
FIG. 8 is a diagram illustrating a TDC array according to an embodiment of the present disclosure.
Figure 9:
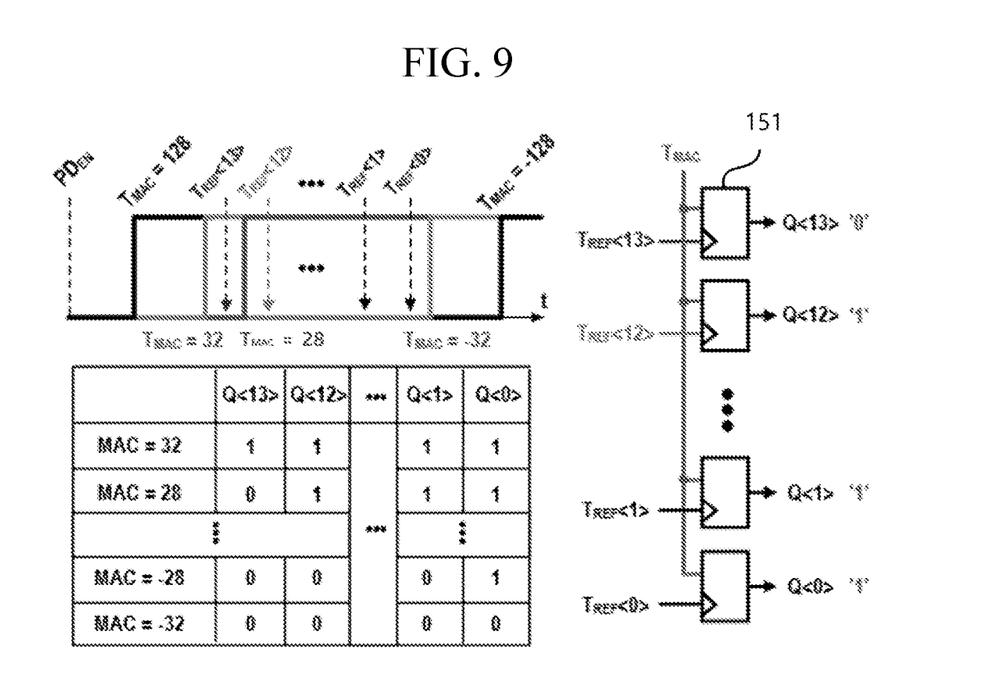
FIG. 9 is a diagram for describing an operation of a TDC array of FIG. 8.

FIG. 8 is a diagram illustrating a TDC array according to an embodiment of the present disclosure, and FIG. 9 is a diagram for describing an operation of a TDC array of FIG. 8.

Referring to FIG. 8, the TDC array 150 includes a plurality of TDC circuits 151. The TDC circuit 151 may be, for example, a D-Flip Flop (DFF), but is not limited thereto. Each of the plurality of TDC circuits 151 receives the second output signal converted into the time domain from the plurality of operation bit lines $MBL_{[0]}$ to $MBL_{[C1]}$, and receives reference signals $T_{REF[0]}$ to $T_{REF[C2]}$ from the plurality of dummy bit lines $DBL_{[0]}$ to $DBL_{[C2]}$. Each of the plurality of TDC circuits 151 compares the converted second output signal with the converted reference signal as described above, and converts the converted second output signal into a digital domain based on the comparison result.

Each of the plurality of TDC circuits 151 may receive the reset signal RST before converting the converted second output signal into the digital domain, and may be in a reset state according to the reset signal RST.

Referring to FIG. 9, for example, when 14 TDC circuits 151 are provided, the second output signal in the time domain is defined as $T_{MAC}$, the reference signals are defined as $T_{REF<0>}$ to $T_{REF<13>}$, and the second output signal converted to the digital domain by the each TDC circuit 151 is defined as Q<0> to Q<13>. As described above, $T_{REF<0>}$ to $T_{REF<13>}$ are signals having different phases by the dummy cell array 130, and are respectively applied to the plurality of TDC circuits 151. The plurality of TDC circuits 151 receive different reference signals $T_{REF<0>}$ to $T_{REF<13>}$ as clock signals, and compare the reference signal with the $T_{MAC}$. According to the comparison result, when the phase of the second output signal is later than the reference signal, each TDC circuit 151 converts the second output signal into logic '0', and when the phase of the second output signal is earlier than the reference signal, each TDC circuit 151 converts the second output signal into logic '1'.

For example, in FIG. 9, when MAC=28, since the phase of the second output signal is late compared to $T_{REF<13>}$, but is early compared to the rest of the reference signals $T_{REF<0>}$ to $T_{REF<12>}$, in the second output signal converted to the digital domain, Q<13> is converted to '0', but the remainders are converted to '1'.

Figure 10:
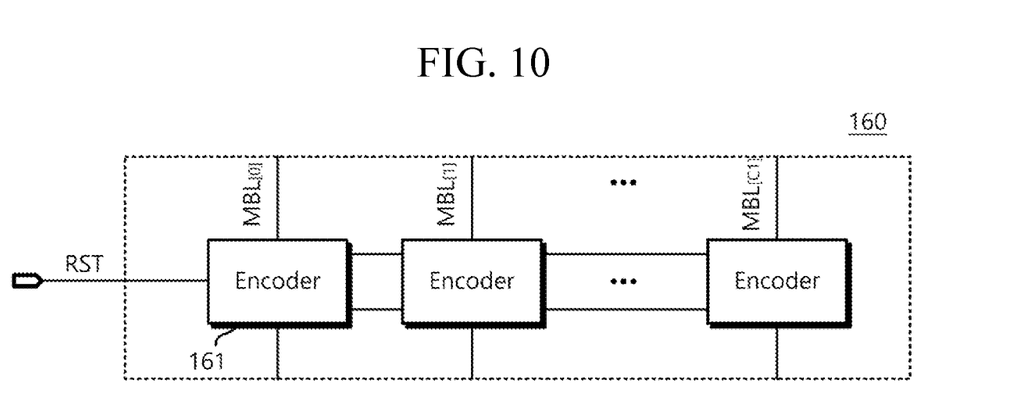
FIG. 10 is a diagram illustrating an encoder array, according to an embodiment of the present disclosure.

FIG. 10 is a diagram illustrating an encoder array, according to an embodiment of the present disclosure.

Referring to FIG. 10, the encoder array 160 includes a plurality of encoders 161. The plurality of encoders 161 are respectively connected to the plurality of operation bit lines $MBL_{[0]}$ to $MBL_{[C1]}$, and encodes the thermometer code (the second output signal converted to the digital domain) to convert the thermometer code into the digital output signal, when the plurality of encoders 161 are enabled depending on an enable signal for an encoding operation, that is, a third enable signal $TDC_{EN}$.

According to the electronic device 100 of the present disclosure described above, since the TDC array 150 and the encoder array 160 are implemented only of simple digital circuits such as the TDC circuit 151 and the encoder 161, the additional required area and power consumption are reduced compared to ADC circuits implemented of analog circuits using passive elements, which are difficult to process miniaturization.

Figure 11:
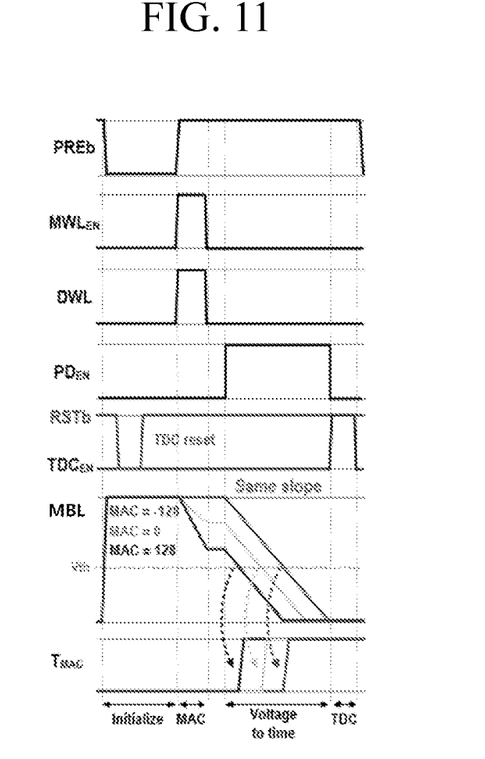
FIG. 11 is a diagram for describing an operation of an electronic device, according to an embodiment of the present disclosure.

FIG. 11 is a diagram for describing an operation of an electronic device, according to an embodiment of the present disclosure. Hereinafter, additional descriptions of the parts overlapping with the above description will be omitted to avoid redundancy.

Referring to FIG. 11, the operation of the electronic device 100 includes an initialization phase, a MAC phase, a voltage to time (VT) phase, and a TDC phase.

In the initialization phase, the electronic device 100 first precharges the plurality of operation bit lines $MBL_{[0]}$ to $MBL_{[C1]}$ to a preset charging voltage, based on the precharging signal PREb. For example, when the precharging circuit 110 operates as an inverse gate-based transistor, precharging is performed in a period in which the precharging signal PREb is logic '0'.

When precharging is performed, the electronic device 100 may initialize the TDC array 150, based on the reset signal RST.

Thereafter, in the MAC phase, an input signal is applied to the plurality of operation word lines $MWL_{[0]}$ to $MWL_{[R]}$ according to the first enable signal $MWL_{EN}$, and the dummy word line signal is also applied to the plurality of dummy word lines DWL. The electronic device 100 performs a MAC operation in the MAC phase, and the plurality of operation bit lines $MBL_{[0]}$ to $MBL_{[C1]}$ have voltage levels according to the MAC operation. For example, in FIG. 11, the voltage level of the second output signal according to the MAC operation is illustrated as having 128, 0, and −128. As described above, it may be understood that the voltage level of the second output signal is reduced by a specific voltage from the preset charging voltage according to precharging.

Thereafter, in the VT phase, the VTC array 140 converts the second output signal from the analog domain to the time domain, based on the second enable signal $PD_{EN}$. In this case, according to an embodiment, when the second output signal is discharged with the same voltage, the second output signal may have a time difference proportional to the difference in voltage levels even though the second output signal has different voltage levels according to the MAC operation and may be converted to the time domain.

Finally, in the TDC phase, the second output signal is converted from the time domain to the digital domain by the TDC array 150 and the encoder array 160, based on the third enable signal $TDC_{EN}$.

According to an embodiment of the present disclosure, a computing-in-memory electronic device supporting current-based analog operation capable of obtaining high energy efficiency and time-based analog-to-digital conversion may be provided by reducing the number of data movement between the memory and the operator in the DNN operation by performing the MAC operation in the memory, and by sequentially converting the operation result into the time domain and the digital domain.

The above description refers to embodiments for implementing the present disclosure. Embodiments in which a design is changed simply or which are easily changed may be included in the present disclosure as well as an embodiment described above. In addition, technologies that are easily changed and implemented by using the above embodiments may be included in the present disclosure. While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. An electronic device comprising:
    a memory cell array including a plurality of memory cells configured to perform a product operation of an input signal applied through a plurality of operation word lines and a pre-stored weight and to output a first output signal according to the product operation to a plurality of operation bit lines;
    a dummy cell array including a plurality of dummy cells configured to generate a reference signal and to output the reference signal to a plurality of dummy bit lines;
    a plurality of VTC(Voltage-to-Time Converter) circuits configured to receive a second output signal obtained by summing the first output signal through the plurality of operation bit lines and the reference signal and to convert the second output signal and the reference signal into a time domain; and
    a plurality of TDC(Time-to-Digital Converter) circuits configured to compare the converted second output signal with the converted reference signal and to convert the converted second output signal into a digital domain based on a result of the comparison.

2. The electronic device of claim 1, wherein the plurality of operation bit lines are charged with a preset charging voltage through a precharging circuit, have a voltage reduced than the preset charging voltage when the input signal is the same as the pre-stored weight, and maintain the preset charging voltage when the input signal is different from the pre-stored weight.

3. The electronic device of claim 1, wherein a pulse width of the input signal is set to be less than or equal to a preset width to maintain a linearity of the second output signal.

4. The electronic device of claim 1, wherein each of the plurality of VTC circuits includes:
    a pull-down circuit configured to generate a pull-down current and to discharge the second output signal and the reference signal based on the pull-down current; and
    a conversion circuit configured to output a signal corresponding to logic '0' when voltages of the second output signal and the reference signal exceed a threshold voltage, and configured to output a signal corresponding to logic '1' when the voltages of the second output signal and the reference signal are equal to or less than the threshold voltage.

5. The electronic device of claim 4, wherein each of the plurality of VTC circuits is configured to discharge the second output signal to a voltage of the same level.

6. The electronic device of claim 1, wherein each of the plurality of dummy cells stores a dummy weight corresponding to logic '0' or logic '1'.

7. The electronic device of claim 6, wherein the plurality of dummy cells are defined as a plurality of dummy columns connected to each of the plurality of dummy bit lines; and
    the reference signal is generated for each of the plurality of dummy columns, and is generated to have an earlier phase in the time domain, as the number of logic '1' increases among the dummy weights stored in each of the plurality of dummy columns.

8. The electronic device of claim 1, wherein each of the plurality of TDC circuits converts the converted second output signal into logic '0' when a phase of the converted second output signal is later than that of the converted reference signal, and converts the converted second output signal into logic '1' when the phase of the converted second output signal is earlier than that of the converted reference signal.

9. An electronic device comprising:
    a control circuit configured to generate a first enable signal, a second enable signal, and a dummy word line signal;
    a driver circuit configured to generate an input signal based on the first enable signal and to transfer the input signal to a plurality of operation word lines;
    a memory cell array configured to perform a product operation of the input signal and a pre-stored weight and to output a first output signal according to the product operation to a plurality of operation bit lines;
    a dummy cell array configured to generate a reference signal based on the dummy word line signal and to output the reference signal to a plurality of dummy bit lines;

a VTC(Voltage-to-Time Converter) array configured to receive a second output signal obtained by summing the first output signal through the plurality of operation bit lines and the reference signal and to convert the second output signal and the reference signal into a time domain; and a TDC(Time-to-Digital Converter) array configured to compare the converted second output signal with the converted reference signal and to convert the converted second output signal into a digital domain based on a result of the comparison.

10. The electronic device of claim 9, wherein the dummy cell array includes a plurality of dummy cells, wherein each of the plurality of dummy cells stores a dummy weight corresponding to logic '0' or logic '1', wherein the plurality of dummy cells are defined as a plurality of dummy columns connected to each of the plurality of dummy bit lines, and wherein the reference signal is generated for each of the plurality of dummy columns, and is generated to have an earlier phase in the time domain, as the number of logic '1' increases among the dummy weights stored in each of the plurality of dummy columns.

* * * * *